US012593465B2

(12) United States Patent
Jin et al.

(10) Patent No.: US 12,593,465 B2
(45) Date of Patent: Mar. 31, 2026

(54) METHOD FOR MANUFACTURING SEMICONDUCTOR DEVICE, AND SEMICONDUCTOR DEVICE

(71) Applicant: CSMC TECHNOLOGIES FAB2 CO., LTD., Jiangsu (CN)

(72) Inventors: Huajun Jin, Wuxi (CN); Guipeng Sun, Wuxi (CN); Feng Lin, Wuxi (CN); Shuxian Chen, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 763 days.

(21) Appl. No.: 17/886,609

(22) Filed: Aug. 12, 2022

(65) Prior Publication Data

US 2022/0384641 A1     Dec. 1, 2022

Related U.S. Application Data

(63) Continuation of application No. PCT/CN2021/101751, filed on Jun. 23, 2021.

(51) Int. Cl.
H10D 30/65     (2025.01)
H01L 21/266     (2006.01)
(Continued)

(52) U.S. Cl.
CPC ........... H10D 30/65 (2025.01); H01L 21/266 (2013.01); H10D 30/0281 (2025.01); H10D 62/107 (2025.01); H10D 62/393 (2025.01)

(58) Field of Classification Search
CPC ............. H10D 30/0221; H10D 30/026; H10D 30/0281; H10D 30/605; H10D 30/64;
(Continued)

(56) References Cited

U.S. PATENT DOCUMENTS 8,492,835 B1 * 7/2013 Wang ................... H10D 62/157
                                                          438/282
9,269,806 B2 * 2/2016 Tsai ..................... H10D 62/157
                (Continued)

FOREIGN PATENT DOCUMENTS

CN          102044563          5/2011
CN          104617139          5/2015
                (Continued)

OTHER PUBLICATIONS

Office Action (with English translation) received in corresponding Application No. JP 2022-557168, dated Oct. 18, 2023, 8 pages.
                (Continued)

*Primary Examiner* — Natalia A Gondarenko
(74) *Attorney, Agent, or Firm* — Dority & Manning, PA

(57) ABSTRACT

A method for manufacturing a semiconductor device, and a semiconductor device. The method includes: providing a semiconductor substrate of a first conductivity type, forming a deep well of a second conductivity type in the semiconductor substrate, forming a channel region of the first conductivity type, a first well region of the first conductivity type, and a drift region of the second conductivity type in the deep well, the first well region and the channel region being spaced by a portion of the deep well, the drift region being located between the channel region and the first well region, forming an ion implantation region of the first conductivity type in the deep well, the ion implantation region being located under the drift region, and forming a source region of the second conductivity type and a drain region of the second conductivity type in the deep well.

18 Claims, 3 Drawing Sheets

(51) Int. Cl.
| | |
| --- | --- |
| *H10D 30/01* | (2025.01) |
| *H10D 62/10* | (2025.01) |
| *H10D 62/17* | (2025.01) |

(58) Field of Classification Search
CPC .... H10D 30/65; H10D 30/655; H10D 30/657; H10D 62/052; H10D 62/10; H10D 62/102; H10D 62/107; H10D 62/109; H10D 62/111; H10D 62/112; H10D 62/113; H10D 62/115; H10D 62/117; H10D 62/124; H10D 62/125; H10D 62/138; H10D 18/00; H10D 64/251; H10D 64/605; H10D 64/666; H10D 84/144; H10D 84/153; H10D 84/611; H10D 84/619; H10D 62/149; H10D 62/152; H10D 62/153; H10D 62/154; H10D 62/155; H10D 62/156; H10D 62/157; H10D 62/15; H10D 62/159; H10D 62/199; H10D 62/213; H10D 62/393; H10D 62/60; H10D 62/605; H10D 64/258; H10D 84/0128; H10D 84/0156; H10D 84/0191; H10D 84/835; H10D 84/836; H10D 84/859; H01L 21/761; H01L 21/266; H01L 21/041; H01L 21/0415; H01L 21/046; H01L 21/0465; H01L 21/22; H01L 21/2253; H01L 21/265; H01L 21/26506; H01L 21/2652; H01L 21/425
USPC ....... 257/547, 339, 327, 335, 355, 343, 213, 257/288
See application file for complete search history.

(56) References Cited

U.S. PATENT DOCUMENTS

| | | | | |
| --- | --- | --- | --- | --- |
| 2007/0207600 A1* | 9/2007 | You | ..................... | H10D 10/061 |
| | | | | 257/E29.066 |
| 2013/0126968 A1* | 5/2013 | Lin | ..................... | H10D 62/111 |
| | | | | 257/E29.256 |
| 2016/0155795 A1 | 6/2016 | Feng et al. | | |
| 2017/0263763 A1 | 9/2017 | Ryu et al. | | |
| 2019/0097013 A1 | 3/2019 | Chen et al. | | |

FOREIGN PATENT DOCUMENTS

| | | |
| --- | --- | --- |
| CN | 105226058 | 1/2016 |
| CN | 106663699 | 5/2017 |
| CN | 107425046 | 12/2017 |
| CN | 109979801 | 7/2019 |
| JP | 2001168210 A | 6/2001 |
| JP | 2009152371 A | 7/2009 |
| JP | 2010016154 A | 1/2010 |
| WO | WO 2008/156140 A1 | 12/2008 |

OTHER PUBLICATIONS

PCT International Search Report and Written Opinion (w/ English translation) for corresponding PCT Application No. PCT/CN2021/101751, mailed on Sep. 26, 2021, 10 pages.

* cited by examiner

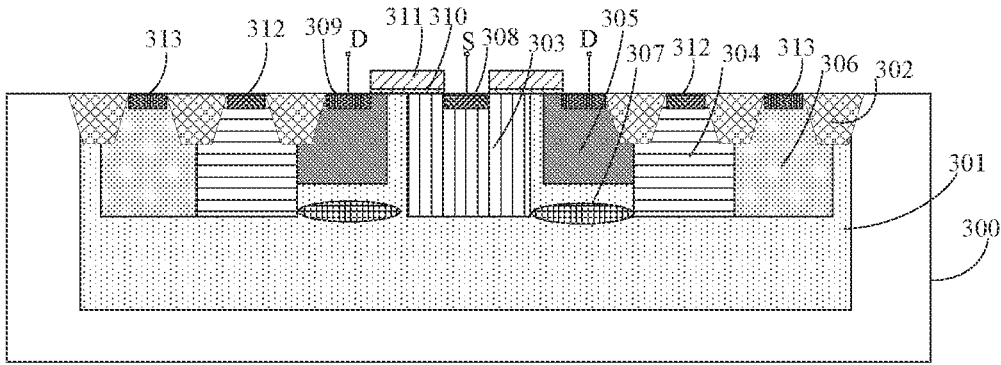

FIG. 1E

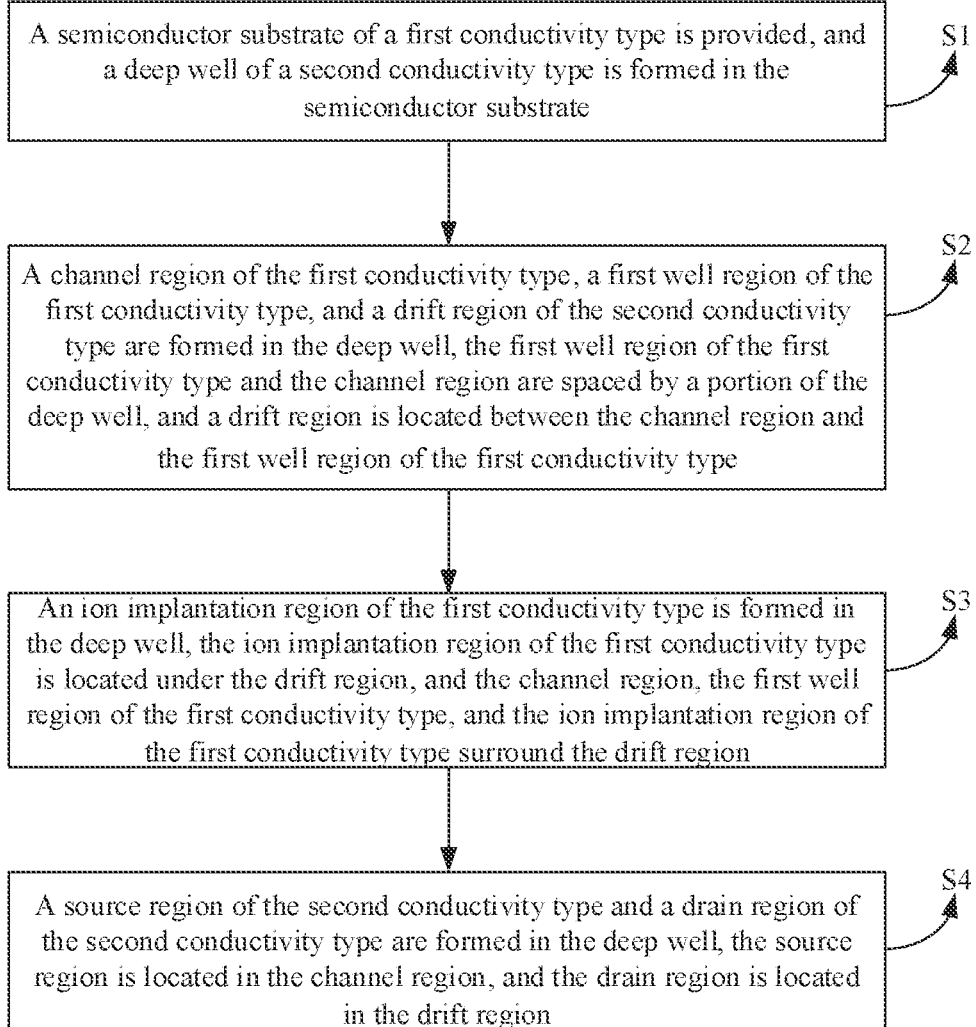

A semiconductor substrate of a first conductivity type is provided, and a deep well of a second conductivity type is formed in the semiconductor substrate

S1

A channel region of the first conductivity type, a first well region of the first conductivity type, and a drift region of the second conductivity type are formed in the deep well, the first well region of the first conductivity type and the channel region are spaced by a portion of the deep well, and a drift region is located between the channel region and the first well region of the first conductivity type

S2

An ion implantation region of the first conductivity type is formed in the deep well, the ion implantation region of the first conductivity type is located under the drift region, and the channel region, the first well region of the first conductivity type, and the ion implantation region of the first conductivity type surround the drift region

S3

A source region of the second conductivity type and a drain region of the second conductivity type are formed in the deep well, the source region is located in the channel region, and the drain region is located in the drift region

METHOD FOR MANUFACTURING SEMICONDUCTOR DEVICE, AND SEMICONDUCTOR DEVICE

CROSS-REFERENCE TO RELATED APPLICATIONS

This application is a continuation application of International Application PCT/CN2021/101751, filed on Jun. 23, 2021, which claims priority to Chinese Patent Application No. 2020106980174, entitled "METHOD FOR MANUFACTURING SEMICONDUCTOR DEVICE, AND SEMICONDUCTOR DEVICE," filed with the State Intellectual Property Office of China on Jul. 20, 2020, the disclosure of which are hereby incorporated by reference in their entirety.

TECHNICAL FIELD

The present disclosure relates to the technology of semiconductor, and in particular to a method for manufacturing a semiconductor device, and a semiconductor device.

BACKGROUND

What described herein is background information related to the present disclosure and may not necessarily constitute the prior art.

With the continuous development of the semiconductor technology, a lateral double-diffused metal oxide semiconductor field effect transistor (LDMOS) device is widely used due to its good property of short channel. The LDMOS, as a power switching device, may have the characteristics of a relatively high working voltage, a simple process, good compatibility with a low-voltage complementary metal oxide semiconductor transistor (CMOS) circuit in a process, and the like.

It is desired in the industry to provide a LDMOS with higher breakdown voltage and lower on-resistance.

SUMMARY

A series of simplified concepts are introduced in the summary, and will be further described in detail in the detailed description of the embodiments. The summary of the disclosure is not intended to define key features and essential technical features of the claimed technical solutions, and is not intended to determine the scope of protection of the claimed technical solutions.

In order to solve the problem in the related art, the present disclosure provides a method for manufacturing a semiconductor device, including: providing a semiconductor substrate of a first conductivity type, and forming a deep well of a second conductivity type in the semiconductor substrate; forming a channel region of the first conductivity type, a first well region of the first conductivity type, and a drift region of the second conductivity type in the deep well of the second conductivity type, the first well region of the first conductivity type and the channel region of the first conductivity type being spaced by a portion of the deep well of the second conductivity type, the drift region of the second conductivity type being located between the channel region of the first conductivity type and the first well region of the first conductivity type; forming an ion implantation region of the first conductivity type in the deep well of the second conductivity type, the ion implantation region of the first conductivity type being located under the drift region of the second conductivity type, the channel region of the first conductivity type, the first well region of the first conductivity type, and the ion implantation region of the first conductivity type surrounding the drift region of the second conductivity type; and forming a source region of the second conductivity type and a drain region of the second conductivity type in the deep well of the second conductivity type, the source region of the second conductivity type being located in the channel region of the first conductivity type, and the drain region of the second conductivity type being located in the drift region of the second conductivity type.

The present disclosure further provides a semiconductor device, including: a semiconductor substrate of a first conductivity type; a deep well of a second conductivity type, extending from an upper surface of the semiconductor substrate of the first conductivity type to an interior of the semiconductor substrate of the first conductivity type; a channel region of the first conductivity type, located in the deep well of the second conductivity type; a first well region of the first conductivity type, located in the deep well of the second conductivity type; a drift region of the second conductivity type, located in the deep well of the second conductivity type and located between the channel region of the first conductivity type and the first well region of the first conductivity type, the drift region of the second conductivity type and the channel region of the first conductivity type being spaced, and the drift region of the second conductivity type being adjacent to the first well region of the first conductivity type; an ion implantation region of the first conductivity type, located in the deep well of the second conductivity type and under the drift region of the second conductivity type, where the channel region of the first conductivity type, the first well region of the first conductivity type and the ion implantation region of the first conductivity type are configured to surround the drift region of the second conductivity type; a source region of the second conductivity type, located in the channel region of the first conductivity type; and a drain region of the second conductivity type, located in the drift region of the second conductivity type.

The details of one or more embodiments of the present disclosure are described in the accompanying drawings and specification below. Other features, objectives, and advantages of the present disclosure will become apparent from the specification, the drawings and the claims.

BRIEF DESCRIPTION OF THE DRAWINGS

The accompanying drawings of the present disclosure, as a part of the present disclosure, are used herein for understanding the present disclosure. The drawings illustrate embodiments of the disclosure, and, together with the description, are used to explain the principles of the disclosure.

In the drawings:

FIG. 1A to FIG. 1E are schematic structural views showing a semiconductor device formed by a method for manufacturing the semiconductor device according to an embodiment of the present disclosure.

FIG. 2 is a flowchart of the method for manufacturing the semiconductor device according to an embodiment of the present disclosure.

DETAILED DESCRIPTION OF THE EMBODIMENTS

Figure 1A:
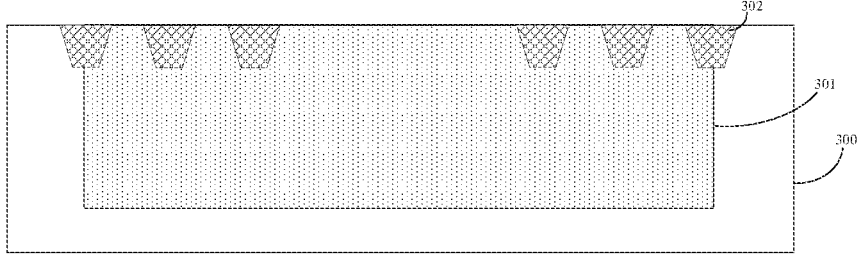

In the following description, numerous specific details are provided to make the disclosure thoroughly understood.

However, it will be apparent to those skilled in the art that the disclosure may be implemented without one or more of these specific details. In other examples, in order to avoid confusion with the present disclosure, some common known technical features in the art are not described.

To make the present disclosure thoroughly understood, a detailed description will be set forth hereinafter to illustrate a method for manufacturing a semiconductor device, a semiconductor device, and an electronic device of the present disclosure. Obviously, the implementation of the present disclosure is not limited to the specific details known to those skilled in the art of semiconductor. The preferable embodiments of the present disclosure are described in detail below, however, in addition to these detailed descriptions, the disclosure may also have other embodiments.

It should be noted that the terminology is used herein only to describe particular embodiments, but not intended to limit the exemplary embodiments according to the disclosure. As used herein, a term in the singular form is intended to include the term in a plural form as well, unless the context clearly indicates otherwise. Furthermore, it should also be understood that when the terms "include" and/or "comprise" are used in this specification, they indicate the presence of features, integers, steps, operations, elements, and/or components, but do not exclude the presence or addition of one or more other features, integers, steps, operations, elements, components, and/or combinations thereof.

Exemplary embodiments according to the present disclosure will be described in more detail with reference to the accompanying drawings herein. However, these exemplary embodiments maybe implemented in various forms and should not be construed as limitations to the embodiments described herein. It should be understood that these embodiments are provided so that the present application is disclosed thoroughly and completely, and that the concepts of these exemplary embodiments are fully conveyed to those skilled in the art. In the drawings, thicknesses of layers and regions are exaggerated for clarity, and the same reference numbers are used to represent the same elements, and thus descriptions thereof may be omitted.

First Embodiment

In an exemplary high-voltage NMOS device with reduced on-resistance, processes of an epitaxial growth and implantation of a buried layer are employed to form an NPNP structure, and an N-type drift region is surrounded by a P-type region, therefore a better depletion effect of the drift region may be obtained, and the drift region may be manufactured to have a higher concentration, and thus the device may have relative small on-resistance. However, additional processes of epitaxial growth and implantation of the buried layer are required, thus increasing the manufacturing cost as well as the difficulty of manufacturing process.

The present disclosure provides a method for manufacturing a semiconductor device, and the method includes following steps.

A semiconductor substrate of a first conductivity type is provided, and a deep well of a second conductivity type is formed in the semiconductor substrate.

A channel region of the first conductivity type, a first well region of the first conductivity type, and a drift region of the second conductivity type are formed in the deep well. The first well region of the first conductivity type and the channel region are spaced by a portion of the deep well, and a drift region is located between the channel region and the first well region of the first conductivity type.

An ion implantation region of the first conductivity type is formed in the deep well, the ion implantation region of the first conductivity type is located under the drift region, and the channel region, the first well region of the first conductivity type, and the ion implantation region of the first conductivity type surround the drift region.

A source region of the second conductivity type and a drain region of the second conductivity type are formed in the deep well, the source region is located in the channel region, and the drain region is located in the drift region.

The method for manufacturing the semiconductor device according to the present disclosure will be illustrated with reference to FIG. 1A to FIG. 1E, and FIG. 2. FIG. 1A to FIG. 1E are schematic structural views showing a semiconductor device formed by the method for manufacturing the semiconductor device according to an embodiment of the present disclosure. FIG. 2 is a flowchart of the method for manufacturing the semiconductor device according to an embodiment of the present disclosure.

Firstly, refer to FIG. 2, at a step S1, the semiconductor substrate of the first conductivity type is provided, and the deep well of the second conductivity type is formed in the semiconductor substrate.

FIG. 1A is a schematic structural view illustrating of a semiconductor device with the deep well of the second conductivity type formed in the semiconductor substrate of the first conductivity type according to an embodiment of the present disclosure. As shown in FIG. 1A, the semiconductor substrate 300 is provided. Specifically, the semiconductor substrate 300 may be made of at least one of the following materials: Si, Ge, SiGe, SiC, SiGeC, InAs, GaAs, InP, InGaAs, or other III/V compound semiconductors, a multi-layer structure composed of these semiconductors or the like, or a silicon on insulator (SOI), a stacked silicon on insulator (SSOI), a stacked silicon germanium on insulator (S—SiGeOI), a silicon germanium on insulator (SiGeOI), and a germanium on insulator (GeOI). For example, the semiconductor substrate is of the first conductivity type.

It should be noted that the first conductivity type and the second conductivity type in the present specification generally refer to a P-type or an N-type. For example, a first conductivity type is one of a P-type, a low doped (P−)-type, and a high doped (P+)-type, and the second conductivity type is one of an N-type, a low doped (N−)-type, and a high doped (N+)-type. Alternatively, the first conductivity type is one of the N-type, the low doped (N−)-type, the high doped (N+)-type, and the second conductivity type is one of the P-type, the low doped (P−)-type, and the high doped (P+)-type.

In an exemplary embodiment, the semiconductor substrate of the first conductivity type is a low doped P-type substrate.

In an exemplary embodiment, the semiconductor substrate is a non-epitaxial substrate. In this embodiment, the method for manufacturing the semiconductor device is performed on a non-epitaxial processing platform, which makes an additional epitaxial process and an additional process of the buried layer unnecessary in the manufacturing process. That is, the device with better characteristics may be obtained on the non-epitaxial processing platform by optimizing a structure design of the device, which can reduce the process cost, reduce the process difficulty, and improve the compatibility of the processing platform as well.

Referring to FIG. 1A again, a deep well 301 of the second conductivity type is formed in the semiconductor substrate 300. The method for forming the deep well of the second conductivity type includes following steps. A patterned mask layer is formed on the semiconductor substrate, and the patterned mask layer exposes a region for forming the deep well of the second conductivity type. An ion implantation is performed for the deep well of the second conductivity type, to form the deep well of the second conductivity type in the semiconductor substrate of the first conductivity type. The patterned mask layer is removed. In an exemplary embodiment, the ion implantation performed for the deep well of the second conductivity type is a high-energy ion implantation.

In an exemplary embodiment, after the ion implantation is performed for the deep well of the second conductivity type, the method further includes an annealing process for the deep well of the second conductivity type.

In this embodiment, the semiconductor substrate of the first conductivity type is a low doped P-type substrate, i.e., a (P–)-type substrate, and the deep well of the second conductivity type is an N-type well.

In an exemplary embodiment, a doping concentration of the deep well of the second conductivity type increases with an increasing depth in the depth direction.

The doping concentration of the deep well of the second conductivity type increases with increasing depth in the depth direction, which may enhance the isolation effect of the deep well of the second conductivity type in the device structure, especially for other well regions subsequently formed in the deep well of the second conductivity type. The other well regions formed in the deep well of the second conductivity type may be first well regions of the first conductivity type.

In an exemplary embodiment, as shown in FIG. 1A, the method further includes a step of forming an isolation structure 302 in the semiconductor substrate 300 before forming the deep well 301 of the second conductivity type in the semiconductor substrate 300. The isolation structure 302 may be a shallow trench isolation structure. A method for forming the shallow trench isolation structure may include following steps. A photolithography process is performed to form a patterned mask layer on the semiconductor substrate, and the patterned mask layer exposes a region for forming the isolation structure. An etching process, in which the patterned mask layer functions as a mask, is performed to etch the semiconductor substrate to form a shallow trench in the semiconductor substrate. A deposition process is performed to form an isolation material layer filling the shallow trench. A chemical mechanical polishing process is performed to remove the isolation material layer outside the shallow trench.

In an exemplary embodiment, the isolation structure includes a first isolation structure and a second isolation structure. The first isolation structure is located between a region for forming a drift region and a region for forming a first well region of the first conductivity type. The second isolation structure is located between a region for forming the first well region of the first conductivity type and a region for forming a second well region of the second conductivity type.

Referring to FIG. 2 again, at a step S2, a channel region of the first conductivity type, a first well region of the first conductivity type, and a drift region of the second conductivity type are formed in the deep well, the first well region of the first conductivity type and the channel region are spaced by a portion of the deep well, and the drift region is located between the channel region and the first well region of the first conductivity type.

Figure 1B:
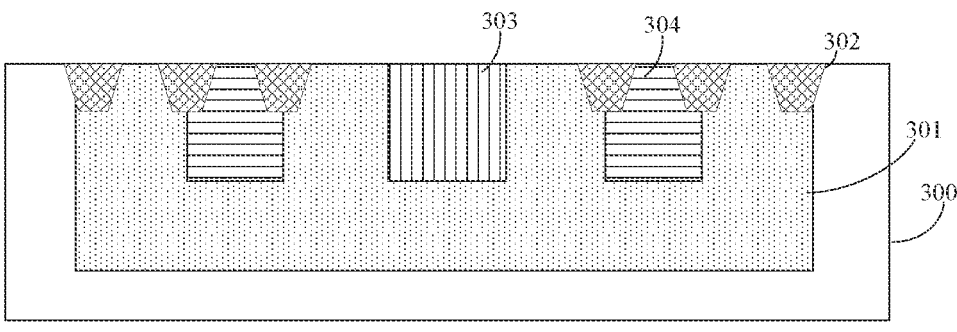

FIG. 1B is a schematic structural view illustrating a semiconductor device, in which the channel region of the first conductivity type and the first well region of the first conductivity type are formed in the deep well of the second conductivity type according to an embodiment of the present disclosure. As shown in FIG. 1B, the channel region 303 of the first conductivity type and the first well region 304 of the first conductivity type are formed in the region of the deep well 301 of the second conductivity type in the semiconductor substrate 300. The first well region 304 of the first conductivity type and the channel region 303 are spaced by the portion of the deep well 301 of the second conductivity type.

In an exemplary embodiment, the step of forming the channel region 303 of the first conductivity type includes following steps. A photolithography process is performed to form a patterned mask layer exposing a region for forming the channel region. An ion implantation process is performed to form the channel region.

In this embodiment, the semiconductor substrate of the first conductivity type is the low doped P-type substrate, i.e., the (P–)-type substrate. The deep well of the second conductivity type is the N-well. The channel region of the first conductivity type is a doped P-type region.

In an exemplary embodiment, the step of forming the first well region 304 of the first conductivity type includes following steps. A photolithography process is performed to form a patterned mask layer exposing a region for forming the first well region of the first conductivity type. An ion implantation process is performed to form the first well region of the first conductivity type.

In this embodiment, the semiconductor substrate the first conductivity type is a low doped P-type substrate, i.e., the (P–)-type substrate. The deep well of the second conductivity type is the N-well. The first well region of the first conductivity type is a doped P-type region.

The first well region of the first conductivity type is formed in the deep well, and the first well region of the first conductivity type, together with the channel region of the first conductivity type and a subsequently formed ion implantation region of the first conductivity type under a drift region, forms a surrounding structure for the drift region, which can effectively improve the depletion effect of the drift region at a drain terminal and increase the breakdown voltage. Ultimately, an NPNP device structure is formed in the LDMOS device, thereby greatly improving the performance of the device. In addition, a high-voltage device structure can be realized even without the process of forming a buried layer.

In an exemplary embodiment of the present disclosure, the step of forming the channel region of the first conductivity type and the step of forming the first well region of the first conductivity type may be performed by using the same mask and the same ion implantation step, which can reduce process steps and reduce process cost as well.

It should be understood that, in this embodiment, that the channel region of the first conductivity type and the first well region of the first conductivity type are formed in the same step is merely exemplary. It should be understood by those skilled in the art that the channel region of the first conductivity type and the first well region of the first conductivity type may also be formed in different steps, to achieve the technical effects of the present disclosure.

Figure 1C:
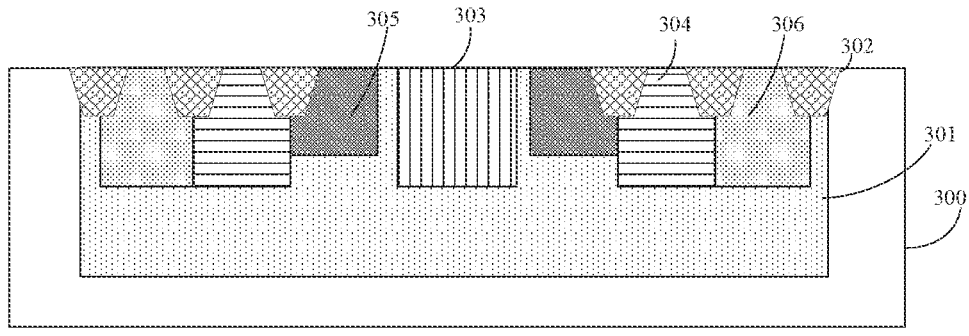

FIG. 1C is a schematic structural view illustrating a semiconductor device, in which a drift region of the second conductivity type is formed in the deep well of the second conductivity type according to an embodiment of the present disclosure.

As shown in FIG. 1C, a drift region 305 of the second conductivity type is formed in the deep well 301 of the second conductivity type in the semiconductor substrate 300, and the drift region 305 is located in a region between the channel region 303 and the first well region 304 of the first conductivity type.

In an exemplary embodiment, the step of forming the drift region 305 of the second conductivity type includes following steps. A photolithography process is performed to form a patterned mask layer exposing the region for forming the drift region of the second conductivity type. An ion implantation process is performed to form the drift region of the second conductivity type.

In this embodiment, the semiconductor substrate the first conductivity type is the low doped P-type substrate, i.e., the (P−)-type substrate. The deep well of the second conductivity type is the N-well. The drift region of the second conductivity type is a doped N-type region.

In an exemplary embodiment of the present disclosure, during formation of the drift region, a step of forming a second well region of the second conductivity type in the deep well is further included. The second well region of the second conductivity type is disposed on a side of the first well region of the first conductivity type, which is away from the channel region. The second well region of the second conductivity type is configured to form a contact region of the deep well of the second conductivity type to lead out the deep well of the second conductivity type, and configured to isolate the first well region of the first conductivity type from the semiconductor substrate as well.

Referring to FIG. 1C again, the second well region 306 of the second conductivity type is formed in the deep well 301 of the second conductivity type in the semiconductor substrate 300, and the second well region 306 of the second conductivity type is located on the side of the first well region 304 of the first conductivity type, which is away from the channel region 303.

In an exemplary embodiment, the step of forming the second well region 306 of the second conductivity type includes following steps. A photolithography process is performed to form a patterned mask layer exposing the region for forming the second well region of the second conductivity type. An ion implantation process is performed to form the second well region of the second conductivity type.

In this embodiment, the semiconductor substrate of the first conductivity type is the low doped P-type substrate, i.e., the (P−)-type substrate, and the deep well of the second conductivity type is the N-type well. The second well region of the second conductivity type is a doped N-type region.

It should be understood that, in this embodiment, that the second well region of the second conductivity type is formed after the formation of the drift region is merely exemplary. It should be understood by those skilled in the art that the second well region of the second conductivity type may be formed during the formation of the drift region, or before the drift region is formed, to implement the present disclosure.

Referring to FIG. 2 again, at a step S3, an ion implantation region of the first conductivity type is formed in the deep well, and the ion implantation region of the first conductivity type is located under the drift region, such that the channel region, the first well region of the first conductivity type, and the ion implantation region of the first conductivity type surround the drift region.

Figure 1D:
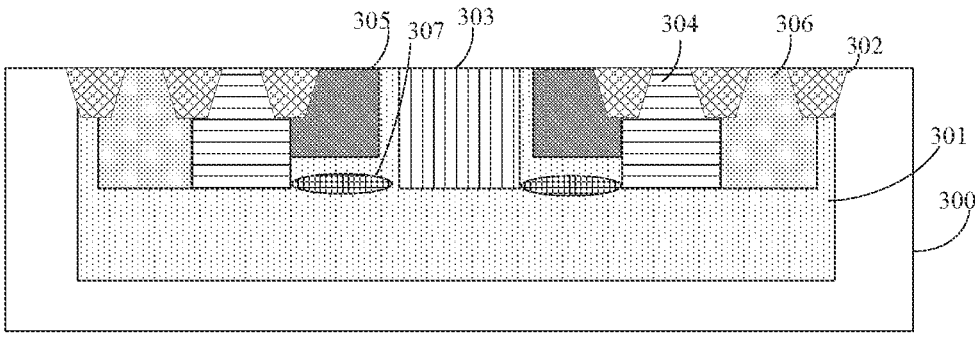

FIG. 1D is a schematic structural view illustrating a semiconductor device, in which an ion implantation region of the first conductivity type is formed below the drift region of the second conductivity type according to an embodiment of the present disclosure.

As shown in FIG. 1D, the ion implantation region 307 of the first conductivity type is formed in the deep well 301 of the second conductivity type in the semiconductor substrate 300, and the ion implantation region 307 of the first conductivity type is located under the drift region 305, such that the channel region 303 of the first conductivity type, the first well region 304 of the first conductivity type, and the ion implantation region 307 of the first conductivity type surround the drift region 305.

In an exemplary embodiment, the step of forming the ion implantation region 307 of the first conductivity type includes following steps. A photolithography process is performed to form a patterned mask layer exposing the region for forming the drift region. An ion implantation process is performed to form the ion implantation region 307 of the first conductivity type.

In this embodiment, the semiconductor substrate of the first conductivity type is the low doped P-type substrate, i.e., the (P−)-type substrate, and the deep well of the second conductivity type is the N-type well. The ion implantation region 307 of the first conductivity type is a doped P-type region.

The ion implantation region of the first conductivity type is formed under the drift region, and the ion implantation region of the first conductivity type, together with the channel region of the first conductivity type and the first well region of the first conductivity type, forms a surrounding structure for the drift region, which can effectively improve the depletion effect of the drift region at the drain terminal, and increase the breakdown voltage. Ultimately, the NPNP device structure is formed in the LDMOS device, to enable the channel region to be isolated from the semiconductor substrate by the deep well region, so that the channel region is not affected by the voltage at the substrate, thereby greatly improving the performance of the device. In addition, the high-voltage device structure can be realized even without the process of forming a buried layer.

In an exemplary embodiment according to the present disclosure, the same mask plate is common to the step of forming the drift region in the deep well and the step of forming the ion implantation region of the first conductivity type in the deep well, thereby reducing process cost.

Further, in an exemplary embodiment according to the present disclosure, the step of forming the ion implantation region of the first conductivity type in the deep well is performed after the step of forming the drift region in the deep well, so that the same mask plate may be common to the step of forming the drift region and the step of forming the ion implantation region of the first conductivity type. As a result, as compared with related technology, no additional process is needed to realize the novel device structure, which can greatly reduce the process cost.

It should be noted that, in this embodiment, the channel region, the first well region of the first conductivity type, the drift region, the second well region of the second conductivity type, the ion implantation region of the first conductivity type and the like are respectively formed in steps S2 and S3, which, however, is not intended to limit the order of forming the channel region, the first well region of the first conductivity type, the drift region, the second well region of the second conductivity type, the ion implantation region of the first conductivity type. Nevertheless, the first well region of the first conductivity type, the drift region, the second well region of the second conductivity type and the ion implantation region of the first conductivity type may be formed in any implementable order, which all can achieve the manufacturing of the semiconductor device and the technical effects of the present disclosure without employing the processes of epitaxial growth and forming the buried layer.

Referring to FIG. 2 again, at a step S4, a source region of the second conductivity type and a drain region of the second conductivity type are formed in the deep well, the source region is located in the channel region, and the drain region is located in the drift region.

FIG. 1E is a schematic structural view illustrating a semiconductor device, in which the source region and the drain region are formed according to an embodiment the present disclosure. As shown in FIG. 1E, the source region 308 and the drain region 309 are formed in the semiconductor substrate 300. The source region 308 is located in the channel region 303, and the drain region 309 is located in the drift region 305.

In this embodiment, the semiconductor substrate of the first conductivity type is the low doped P-type substrate, i.e., the (P−)-type substrate, and the deep well of the second conductivity type is the N-type well. The source region and the drain region are doped (N+)-type regions.

In an exemplary embodiment according to the present disclosure, a step of forming a gate structure is included before the source region and the drain region are formed. As shown in FIG. 1E, the gate structure including a gate dielectric layer 310 and a gate material layer 311 is formed on a surface of the semiconductor substrate 300, and the gate structure exposes a region for forming the source region and the drain region. In an exemplary embodiment, the step of forming the gate structure may be a common process in the art, which is not described herein again.

In an exemplary embodiment according to the present disclosure, a first leading-out region of the first well region of the first conductivity type and a second leading-out region of the second well region of the second conductivity type are further formed in the semiconductor substrate.

In this embodiment, the first conductivity type is the P-type, the second conductivity type is the N-type, and the semiconductor substrate of the first conductivity type is the low doped P-type substrate, i.e., the (P−)-type substrate, and the drift region of the second conductivity type is an N-type drift region.

As shown in FIG. 1E, the first well region 304 of the first conductivity type, the ion implantation region 307 of the first conductivity type, and the channel region 303 form a first P-type surrounding structure surrounding the drift region 305 of the second conductivity type.

The second well region 306 of the second conductivity type and the deep well 301 of the second conductivity type form an N-type surrounding structure surrounding the first P-type surrounding structure.

The outermost semiconductor substrate 300 of the first conductivity type forms a second P-type surrounding structure surrounding the N-type surrounding structure.

The N-type drift region, the first P-type surrounding structure, the N-type surrounding structure and the second P-type surrounding structure from an NPNP structure of the device structure, thereby increasing the breakdown voltage and reducing the on-resistance.

For the NPNP structure, the first leading-out region 312 of the first well region of the first conductivity type and the second leading-out region 313 of the second well region of the second conductivity type are configured to lead out the first well region 304 of the first conductivity type and the second well region 306 of the second conductivity type to an external circuit, respectively. The drain region 309 and the second well region 306 of the second conductivity type are separate, and the drain region 309 and the deep well 301 of the second conductivity type are also separate, such that the drain region 309 and the second leading-out region 313 of the second well region of the second conductivity type may be connected to different voltages in the circuit, respectively. Moreover, the first leading-out region 312 of the first well region of the first conductivity type and the semiconductor substrate 300 of the first conductivity type are spaced by the second well region 306 of the second conductivity type and the deep well 301 of the second conductivity type. That is, the first P-type surrounding structure and the second P-type surrounding structure are spaced by the N-type surrounding structure, such that a voltage of the first P-type surrounding structure functioning as a body region may be boosted without being affected by the second P-type surrounding structure, thereby realizing a boost in the voltage of the body region without being affected by the substrate, increasing the breakdown voltage, and reducing the on-resistance. The NPNP structure can be realized without the processes of epitaxial growth and forming the buried layer, which greatly reduces the processes and reduces the manufacturing cost. Moreover, the semiconductor device according to the present disclosure has a higher breakdown voltage and a lower on-resistance.

In the present embodiment, the semiconductor substrate of the first conductivity type is the low doped P-type substrate, i.e., the (P−)-type substrate, the deep well of the second conductivity type is the N-well, the first well region of the first conductivity type is the doped P-type region, the second well region of the second conductivity type is the doped N-type region, the first leading-out region of the first well region of the first conductivity type is a doped (P+)-type region, and the second leading-out region of the second well region of the second conductivity type is a doped (N+)-type region.

Second Embodiment

The present disclosure further provides a semiconductor device, including: a semiconductor substrate of a first conductivity type, a deep well of a second conductivity type located in the semiconductor substrate, a channel region of the first conductivity type and a first well region of the first conductivity type and a drift region of the second conductivity type, which are located in the deep well, and a source region and a drain region. The drift region is located between the channel region and the first well region of the first conductivity type. The source region is located in the channel region, and the drain region is located in the drift region.

The semiconductor device further includes an ion implantation region of the first conductivity type located under the drift region. The channel region, the first well region of the first conductivity type, and the ion implantation region of the first conductivity type are configured to surround the drift region.

FIG. 1E is a schematic structural view illustrating a semiconductor device according to an embodiment of the present disclosure.

As shown in FIG. 1E, the semiconductor device according to the present disclosure includes the semiconductor substrate 300 of the first conductivity type. Specifically, the semiconductor substrate 300 may be made of at least one of the following materials: Si, Ge, SiGe, SiC, SiGeC, InAs, GaAs, InP, InGaAs, or other III/V compound semiconductors, a multi-layer structure composed of these semiconductors, or the like, or a silicon on insulator (SOI), a stacked silicon on insulator (SSOI), a stacked silicon germanium on insulator (S—SiGeOI), a silicon germanium on insulator, and a germanium on insulator (GeOI). For example, the semiconductor substrate is of the first conductivity type.

It should be noted that the first conductivity type and the second conductivity type in the present specification generally refer to a P-type or an N-type. For example, a first conductivity type is one of a P-type, a low doped (P–)-type, and a high doped (P+)-type, and the second conductivity type is one of an N-type, a low doped (N–)-type, and a high doped (N+)-type. Alternatively, the first conductivity type is one of the N-type, the low doped (N–)-type, the high doped (N+)-type, and the second conductivity type is one of the P-type, the low doped (P–)-type, and the high doped (P+)-type.

In an example, in this embodiment, the semiconductor substrate of the first conductivity type is a low P-type doped substrate.

In an exemplary embodiment, the semiconductor substrate is a non-epitaxial substrate. In this embodiment, the semiconductor device is formed on a non-epitaxial processing platform, and the manufacturing method for the semiconductor device is performed on the non-epitaxial processing platform, which makes an additional epitaxial process and an additional process of the buried layer unnecessary in the manufacturing process. That is, the device with better characteristics may be obtained on the non-epitaxial processing platform by optimizing a structure design of the device, which can reduce the process cost, reduce the process difficulty, and improve the compatibility of the processing platform as well.

Referring to FIG. 1E again, the semiconductor device according to the present disclosure further includes a deep well 301 of the second conductivity type located in the semiconductor substrate 300.

In this embodiment, the semiconductor substrate of the first conductivity type is the low doped P-type substrate, i.e., the (P–)-type substrate, and the deep well of the second conductivity type is the N-type well. The deep well of the second conductivity type is a low doped N-type region.

In an exemplary embodiment, a doping concentration of the deep well of the second conductivity type increases with an increasing depth in the depth direction.

Since the doping concentration of the deep well of the second conductivity type increases with the increasing depth in the depth direction, the semiconductor substrate can be isolated from the first well region of the first doped type by the deep well region with an increasing doping concentration when the first well region of the first conductivity type is formed subsequently. In this way, an NPNP structure, which is subsequently formed from a drain terminal to the semiconductor substrate, can be more stable and reliable.

Referring to FIG. 1E again, the semiconductor device according to the present disclosure further includes a channel region 303 of a first conductivity type and a first well region 304 of the first conductivity type and a drift region 305 of the second conductivity type, which are all located in the deep well of the second conductivity type. The drift region 305 is located between the channel region 303 and the first well region 304 of the first conductivity type.

In the present embodiment, the semiconductor substrate of the first conductivity type is the low doped P-type substrate, i.e., the (P–)-type substrate, the deep well of the second conductivity type is an N-well, the channel region of the first conductivity type is a doped P-type region, the first well region of the first conductivity type is a doped P-type region, and the drift region of the second conductivity type is a doped N-type region.

The first well region of the first conductivity type is formed in the deep well, and the first well region of the first conductivity type, together with the channel region of the first conductivity type and a subsequently formed ion implantation region of the first conductivity type under the drift region, is configured to form a surrounding structure for the drift region, which can effectively improve the depletion effect of the drift region at a drain and increase the breakdown voltage. Ultimately, a NPNP device structure is achieved in the LDMOS device, thereby greatly improving the performance of the device, and achieving a high-voltage device structure without the process of forming a buried layer.

Referring to FIG. 1E again, the semiconductor device according to the present disclosure further includes a source region 308 and a drain region 309. The source region 308 is located in the channel region 303, and the drain region 309 is located in the drift region 305.

In this embodiment, the semiconductor substrate of the first conductivity type is the low doped P-type substrate, i.e., the (P–)-type substrate, and the deep well of the second conductivity type is the N-type well. The source region and the drain region are doped (N+)-type regions.

Referring to FIG. 1E again, the semiconductor device according to the present disclosure further includes an ion implantation region 307 of the first conductivity type located under the drift region 305. The channel region 303, the first well region of the first conductivity type 304, and the ion implantation region 307 of the first conductivity type are configured to surround the drift region 305.

The ion implantation region of the first conductivity type is formed under the drift region, and the ion implantation region of the first conductivity type, together with the channel region of the first conductivity type and the first well region of the first conductivity type, is configured to form a surrounding structure for the drift region, which can effectively improve the depletion effect of the drift region at the drain terminal and increase the breakdown voltage. Ultimately, the NPNP device structure is achieved in the LDMOS device, thereby greatly improving the performance of the device, and achieving the high-voltage device structure without the process of forming the buried layer.

In this embodiment, the semiconductor substrate of the first conductivity type is the low doped P-type substrate, i.e., the (P–)-type substrate, and the deep well of the second conductivity type is the N-type well. The ion implantation region 307 of the first conductivity type is a doped P-type region.

In an exemplary embodiment of the present disclosure, the semiconductor device further includes a second well region 306 of the second conductivity type. The second well region 306 of the second conductivity type is disposed on a side of the first well region 304 of the first conductivity type, which is away from the channel region 303. The second well region of the second conductivity type is configured to form a contact region of the deep well of the second conductivity type to lead out the deep well of the second conductivity type, and is configured to isolate the first well region of the first conductivity type from the semiconductor substrate as well.

In this embodiment, the semiconductor substrate of the first conductivity type is the low doped P-type substrate, i.e., the (P–)-type substrate, and the deep well of the second conductivity type is the N-type well. The second well region of the second conductivity type is the doped N-type region.

In an exemplary embodiment of the present disclosure, a first leading-out region of the first well region of the first conductivity type and a second leading-out region of the second well region of the second conductivity type, which are formed in the semiconductor substrate, are further included.

As shown in FIG. 1E, the first leading-out region 312 of the first well region of the first conductivity type and the second leading-out region 313 of the second well region of the second conductivity type are configured to lead out the first well region 304 of the first conductivity type and the second well region 306 of the second conductivity type to an external circuit, respectively. The drain region 309 and the second well region 306 of the second conductivity type are separate, and the drain region 309 and the deep well 301 of the second conductivity type are also separate, such that the drain region 309 and the second leading-out region 313 of the second well region of the second conductivity type may be connected to different voltages in the circuit, respectively. Moreover, the first leading-out region 312 of the first well region of the first conductivity type and the semiconductor substrate 300 of the first conductivity type are spaced by the second well region 306 of the second conductivity type and the deep well 301 of the second conductivity type, which can increase the breakdown voltage and reduce the on-resistance and can achieve the NPNP structure without the process of epitaxial growth and the process of forming the buried layer, thereby greatly reducing the processes and the manufacturing cost. Moreover, the semiconductor device according to the present disclosure has a higher breakdown voltage and a lower on-resistance.

In an exemplary embodiment according to the present disclosure, a gate structure is further included.

As shown in FIG. 1E, a gate structure including a gate dielectric layer 310 and a gate material layer 311 is arranged on a surface of the semiconductor substrate 300.

In an exemplary embodiment according to the present disclosure, an isolation structure 302 formed in the semiconductor substrate is further included. In an exemplary embodiment, the isolation structure includes a first isolation structure and a second isolation structure. The first isolation structure is located between the drift region and the first well region of the first conductivity type, and the second isolation structure is located between the first well region of the first conductivity type and the second well region of the second conductivity type.

In an exemplary embodiment according to the present disclosure, a semiconductor device manufactured by the method for manufacturing the semiconductor device of the first embodiment is provided.

The semiconductor device of the present disclosure, by configuring the first well region of the first conductivity type, the ion implantation region and the channel region to surround the drift region, provides a novel structure, effectively improves the depletion of the drain drift region, increases the breakdown voltage, and reduces the on-resistance. The semiconductor device of the present disclosure, by arranging the drift region, the well regions, the ion implantation region and the channel region in the deep well located in the semiconductor substrate, achieves the NPNP device structure in the LDMOS device, makes the channel region and the semiconductor substrate to be separated by the deep well region, so that the channel region will not be affected by the voltage at the substrate, thereby greatly improving the performance of the device. No buried layer is arranged in the device structure, which can simplify the manufacturing processes and reduce the manufacturing cost as well.

Although the present disclosure has been described with reference to the above embodiments, it should be understood that the above embodiments are used for illustration and description only, but not intended to limit the disclosure to the scope of the described embodiments. In addition, it should be understood by those skilled in the art that, the present disclosure is not limited to the embodiments described above, various deformations and modifications may be made in view of the present disclosure, and these deformations and modifications are all within the scope of the present disclosure. The scope of the disclosure is defined by the appended claims and their equivalents.

What is claimed is:

1. A method for manufacturing a semiconductor device, comprising:

providing a semiconductor substrate of a first conductivity type, and forming a deep well of a second conductivity type in the semiconductor substrate of the first conductivity type;

forming a channel region of the first conductivity type, a first well region of the first conductivity type, and a drift region of the second conductivity type in the deep well of the second conductivity type; the first well region of the first conductivity type and the channel region of the first conductivity type being spaced by a portion of the deep well of the second conductivity type; the drift region of the second conductivity type being located between the channel region of the first conductivity type and the first well region of the first conductivity type;

forming an ion implantation region of the first conductivity type in the deep well of the second conductivity type; the ion implantation region of the first conductivity type being located under the drift region of the second conductivity type; the channel region of the first conductivity type, the first well region of the first conductivity type, and the ion implantation region of the first conductivity type surrounding the drift region of the second conductivity type;

forming a source region of the second conductivity type and a drain region of the second conductivity type in the deep well of the second conductivity type; the source region of the second conductivity type being located in the channel region of the first conductivity type, and the drain region of the second conductivity type being located in the drift region of the second conductivity type; and forming a second well region of the second conductivity type in the deep well of the second conductivity type, wherein the second well region of the second conductivity type is disposed on a side of the first well region of the first conductivity type away from the channel region of the first conductivity type.

2. The method according to claim 1, wherein at least one of a same mask plate and a same mask layer is common to a step of forming the drift region of the second conductivity type in the deep well of the second conductivity type and a step of forming the ion implantation region of the first conductivity type in the deep well of the second conductivity type.

3. The method according to claim 1, wherein the channel region of the first conductivity type and the first well region of the first conductivity type are formed in a same step of ion implantation.

4. The method according to claim 1, wherein a doping concentration of the deep well of the second conductivity type increases with an increasing depth in the depth direction.

5. The method according to claim 1, wherein the method is performed on a non-epitaxial processing platform.

6. The method according to claim 1, wherein before a step of forming the source region of the second conductivity type and the drain region of the second conductivity type in the deep well of the second conductivity type, the method further comprises forming a gate structure.

7. The method according to claim 1, wherein an ion implantation performed for the deep well of the second conductivity type is a high-energy ion implantation.

8. The method according to claim 1, wherein the forming the deep well of the second conductivity type in the semiconductor substrate of the first conductivity type comprises:

forming a patterned mask layer on the semiconductor substrate of the first conductivity type;

the patterned mask layer exposing a region for forming the deep well of the second conductivity type;

performing an ion implantation for the deep well of the second conductivity type to form the deep well of the second conductivity type in the semiconductor substrate of the first conductivity type; and removing the patterned mask layer.

9. The method according to claim 8, wherein, after the performing the ion implantation for the deep well of the second conductivity type, the method further comprises annealing the deep well of the second conductivity type.

10. The method according to claim 1, wherein, before the forming the deep well of the second conductivity type in the semiconductor substrate of the first conductivity type, the method further comprises forming an isolation structure in the semiconductor substrate first conductivity type, wherein the isolation structure is a shallow trench isolation structure.

11. The method according to claim 1, further comprising: forming a first leading-out region of the first well region of the first conductivity type and a second leading-out region of the second well region of the second conductivity type in the semiconductor substrate of the first conductivity type.

12. A semiconductor device, comprises:

a semiconductor substrate of a first conductivity type;

a deep well of a second conductivity type, extending from an upper surface of the semiconductor substrate of the first conductivity type to an interior of the semiconductor substrate of the first conductivity type;

a channel region of the first conductivity type, located in the deep well of the second conductivity type;

a first well region of the first conductivity type, located in the deep well of the second conductivity type;

a drift region of the second conductivity type, located in the deep well of the second conductivity type and located between the channel region of the first conductivity type and the first well region of the first conductivity type, the drift region of the second conductivity type and the channel region of the first conductivity type being spaced, and the drift region of the second conductivity type being adjacent to the first well region of the first conductivity type;

an ion implantation region of the first conductivity type, located in the deep well of the second conductivity type and under the drift region of the second conductivity type, wherein the channel region of the first conductivity type, the first well region of the first conductivity type and the ion implantation region of the first conductivity type are configured to surround the drift region of the second conductivity type;

a source region of the second conductivity type, located in the channel region of the first conductivity type;

a drain region of the second conductivity type, located in the drift region of the second conductivity type; and a second well region of the second conductivity type located in the deep well of the second conductivity type, wherein the second well region of the second conductivity type is disposed on a side of the first well region of the first conductivity type away from the channel region of the first conductivity type.

13. The semiconductor device according to claim 12, further comprising a gate structure located on the deep well of the second conductivity type.

14. The semiconductor device according to claim 12, wherein the semiconductor device is a lateral double-diffused metal oxide semiconductor field effect transistor.

15. The semiconductor device according to claim 12, wherein the semiconductor substrate is a non-epitaxial substrate.

16. The semiconductor device according to claim 12, further comprising:

a first leading-out region of the first well region of the first conductivity type, located in the first well region of the first conductivity type, and a second leading-out region of the second well region of the second conductivity type, located in the second well region of the second conductivity type.

17. The semiconductor device according to claim 12, further comprising an isolation structure, wherein:

the isolation structure comprises a first isolation structure and a second isolation structure;

the first isolation structure is located between the drift region of the second conductivity type and the first well region of the first conductivity type; and the second isolation structure is located between the first well region of the first conductivity type and the second well region of the second conductivity type.

18. The semiconductor device according to claim 12, wherein a doping concentration of the deep well of the second conductivity type increases with an increasing depth in the depth direction.

* * * * *